(12) United States Patent
Ryan et al.

(10) Patent No.: US 9,007,235 B2
(45) Date of Patent: Apr. 14, 2015

(54) CORNER SENSOR ASSEMBLY

(71) Applicant: Sentry Protection LLC, Lakewood, OH (US)

(72) Inventors: James P. Ryan, Lakewood, OH (US); Jeffrey P. Wagner, Greenfield, IN (US)

(73) Assignee: Sentry Protection LLC, Lakewood, OH (US)

( * ) Notice: Subject to any disclaimer, the term of this patent is extended or adjusted under 35 U.S.C. 154(b) by 0 days.

(21) Appl. No.: 14/196,450

(22) Filed: Mar. 4, 2014

(65) Prior Publication Data

US 2014/0184427 A1 Jul. 3, 2014

Related U.S. Application Data

(63) Continuation of application No. 13/556,845, filed on Jul. 24, 2012, now Pat. No. 8,686,874.

(51) Int. Cl.
*G08G 1/07* (2006.01)
*G08G 1/01* (2006.01)
*G01R 33/10* (2006.01)
*G08G 1/095* (2006.01)
*G08G 1/16* (2006.01)

(52) U.S. Cl.
CPC .............. *G08G 1/166* (2013.01); *G01R 33/10* (2013.01); *G08G 1/095* (2013.01)

(58) Field of Classification Search
CPC ....................................................... G08B 19/00
USPC ................. 340/907, 909, 933, 517, 518, 522, 340/573.1; 701/23, 530, 535; 348/46, 139, 348/142; 725/12; 315/159, 360, 362
See application file for complete search history.

(56) References Cited

U.S. PATENT DOCUMENTS

| | | | |
|---|---|---|---|
| 7,187,282 B2 | 3/2007 | Fergusson | |
| D563,253 S | 3/2008 | Garner | |
| 7,627,199 B2 | 12/2009 | Sato et al. | |
| 2005/0074140 A1 | 4/2005 | Grasso et al. | |
| 2007/0024433 A1 | 2/2007 | Garner | |
| 2010/0162285 A1* | 6/2010 | Cohen et al. ..................... | 725/12 |
| 2011/0148309 A1* | 6/2011 | Reid et al. ..................... | 315/159 |
| 2011/0199337 A1* | 8/2011 | Tang et al. ..................... | 345/175 |
| 2012/0025964 A1 | 2/2012 | Beggs et al. | |
| 2012/0033046 A1 | 2/2012 | Ozaki | |
| 2012/0068974 A1 | 3/2012 | Ogawa | |
| 2013/0099943 A1 | 4/2013 | Subramanya | |

OTHER PUBLICATIONS

Collision Awareness, advertisement (2009).
Crossing Guard, brochure (Feb. 2012).
Corner Zone, photograph (2007).

* cited by examiner

*Primary Examiner* — Van T. Trieu
(74) *Attorney, Agent, or Firm* — Wegman, Hessler & Vanderburg

(57) ABSTRACT

A corner sensor assembly includes a housing having at least one magnet attached thereto, wherein the magnets allow the corner sensor assembly to be readily attached and relocated to corner structures within a building. The assembly includes at least one motion sensor for detecting motion within two opposing fields of monitoring. At least one visual indicator is activated when the motion sensors detect motion within both fields of monitoring and are deactivated when no motion is sensed in at least one of the fields of monitoring. The assembly includes an integrated power supply located within the housing.

13 Claims, 10 Drawing Sheets

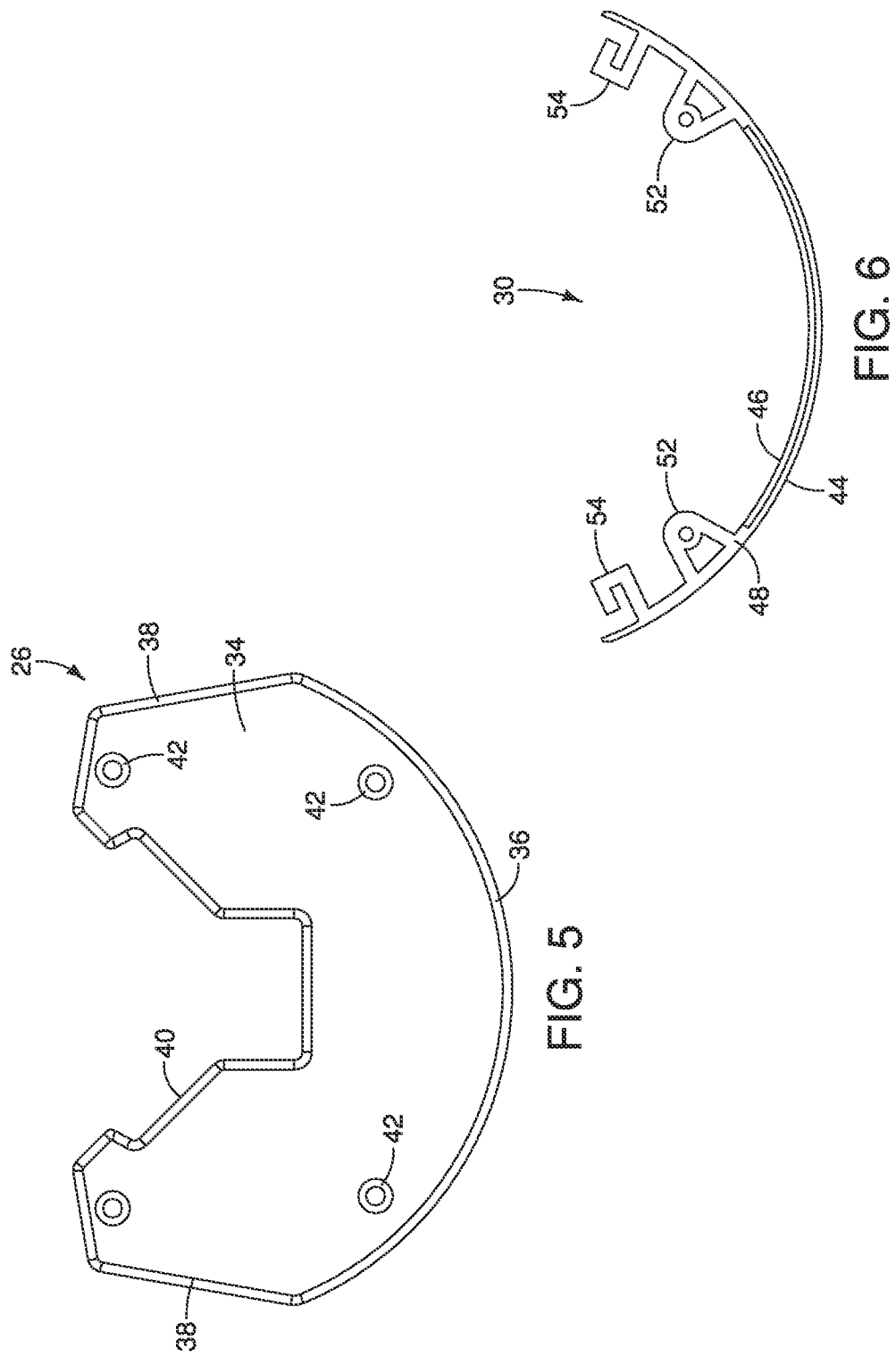

CORNER SENSOR ASSEMBLY

CROSS REFERENCE TO RELATED APPLICATION

This application is a continuation of U.S. patent application Ser. No. 13/556,845 filed Jul. 24, 2012, now U.S. Pat. No. 8,686,874, which is herein incorporated by reference in its entirety.

FIELD OF THE INVENTION

The present invention is directed to a warning device, and, more particularly, to a warning device that senses oncoming traffic at an intersection within a building.

BACKGROUND OF THE INVENTION

Buildings and warehouses often have hallways and corners where potential accidents and collisions occur between pedestrians or pedestrians and moving machinery or vehicles, especially at high-traffic intersections. Some buildings utilize mirrors conveniently placed such that traffic approaching the intersection can see around the corner and determine whether or not there is another approaching pedestrian or vehicle. However, the field of view of these mirrors is limited and if the traffic from adjacent pathways is not aware of the other, collisions often occur. These collisions can cause injury or damage to merchandise or the building structure itself.

It is also known that warning sensors have been utilized on corner structures to alert adjacent pathways of oncoming traffic. However, these sensors typically are hardwired into an electrical system of the building such that removing or relocating the sensor is very labor intensive and time consuming. And when these sensors are relocated, the sensing mechanisms typically require adjustment to change the field of view of the sensing mechanism to accurately sense the adjacent pathways.

A need therefore exists for a corner sensing apparatus having an integrated power source which allows the apparatus to be easily removable and relocatable without extensive re-wiring or labor. A need also exists for a corner sensing apparatus having pre-adjusted sensing mechanisms that do not need to be adjusted each time the apparatus is installed or relocated to a different location.

BRIEF SUMMARY OF THE INVENTION

In one aspect of the present invention, a corner sensor assembly for attachment to a corner structure is provided. The corner sensor assembly includes a housing having an integrated power supply positioned within the housing. A first motion sensor is positioned within the housing and operatively connected to the power supply. The first motion sensor is oriented to sense motion within a first field of monitoring, wherein the first motion sensor generates a first active output when motion is sensed within the first field of monitoring or a first inactive output when no motion is sensed within the first field of monitoring. A second motion sensor is positioned within the housing and operatively connected to the power supply. The second motion sensor is oriented to sense motion within a second field of monitoring, wherein the second motion sensor generates a second active output when motion is sensed within the second field of monitoring or a second inactive output when no motion is sensed within the second field of monitoring. The first field of monitoring is different than the second field of monitoring. At least one visual indicator is operatively connected to the power supply, and the at least one visual indicator is changeable between an active state and an inactive state. A controller is operatively connected to the power supply, the at least one visual indicator, and the first and second motion sensors. The controller receives the outputs from the first and second motion sensors and changes the state of the at least one visual indicator in response to a change in the outputs from the first and second motion sensors. At least one visual indicator is in an active state when the controller receives the active outputs from both of the first and second motion sensors, and the at least one visual indicator is in an inactive state when the controller receives at least one inactive output from the first and second motion sensors.

In another aspect of the present invention, a corner sensor assembly for attachment to a corner structure is provided. The corner sensor assembly includes a housing having a power supply located within the housing. A plurality of integrated sensors are located within the housing for sensing motion within a first field of monitoring and a second field of monitoring, wherein the first and second fields of monitoring are different. Each sensor is directed toward one of the fields of monitoring, and each of the sensors generates an active output when motion is sensed within the field of monitoring being monitored or an inactive output when no motion is sensed within the field of monitoring being monitored. At least one visual indicator is positioned within the housing and operatively connected to the power supply. The at least one visual indicator is changeable between an active state and an inactive state. The at least one visual indicator is viewable from within each of the first and second fields of monitoring. A controller is operatively connected to the power supply, the at least one visual indicator, and the sensors. The controller receives the outputs from the sensors and changes the state of the visual indicators in response to a change in the outputs from the sensors. The at least one visual indicator is in an active state when the controller receives the active outputs from the sensors to indicate sensed motion within both of the fields of monitoring, and the at least one visual indicator is in an inactive state when the controller receives the inactive output from the sensors to indicate no sensed motion within at least one of the fields of monitoring.

In yet another aspect of the present invention, a corner sensor assembly for attachment to a corner structure is provided. The corner sensor assembly includes a housing having a power supply located within the housing. A first motion sensor is located within the housing for sensing motion within a first field of monitoring and a second motion sensor is located within the housing for sensing motion within a second field of monitoring. The first and second fields of monitoring are different. Each of the motion sensors generates a continuous output, wherein the motion sensors are pre-adjusted and have a fixed field of view. At least one visual indicator is visible within both of said fields of monitoring, and the at least one visual indicator is operatively connected to said power supply. A controller is operatively connected to the power supply, the at least one visual indicator, and the motion sensors. The controller receives the outputs from the sensors and changes a state of the at least one visual indicator in response to a change in the outputs from the sensors. The at least one visual indicator is in an active state when the output from both of the motion sensors received by the controller are active outputs to indicate sensed motion within both of the fields of monitoring, and the at least one visual indicator is in an inactive state when at least one of the outputs from the motion sensors received by the controller is an inactive output to indicate no sensed motion within at least one of the fields of monitoring Advantages of the present invention will become more apparent to those skilled in the art from the following description of the embodiments of the invention which have been shown and described by way of illustration. As will be realized, the invention is capable of other and different embodiments, and its details are capable of modification in various respects.

BRIEF DESCRIPTION OF SEVERAL VIEWS OF THE DRAWINGS

These and other features of the present invention, and their advantages, are illustrated specifically in embodiments of the invention now to be described, by way of example, with reference to the accompanying diagrammatic drawings, in which:

FIG. 5 is a top view of an upper end cap;

FIG. 6 is a top view of a front cover;

Figure 1:
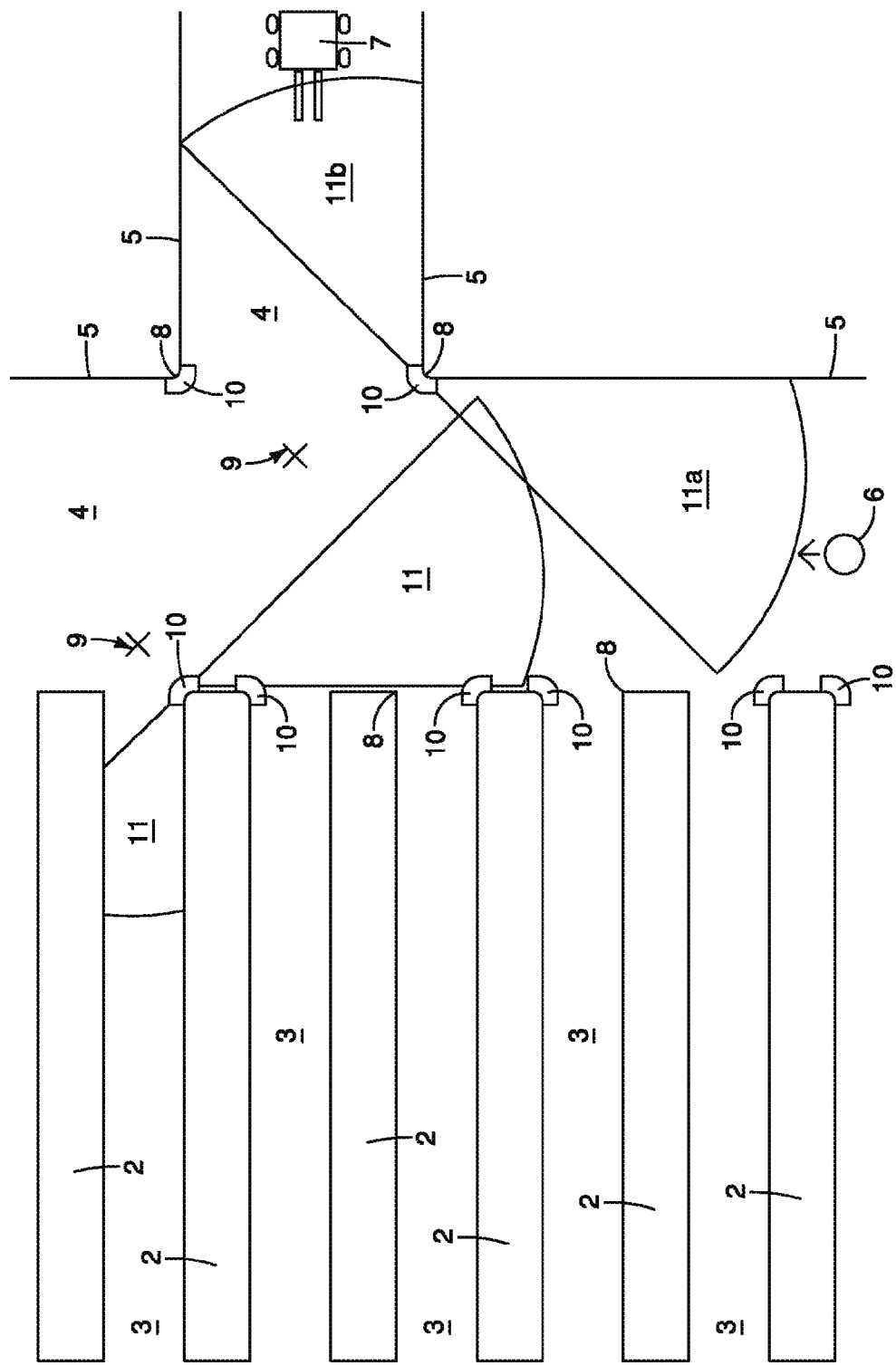
FIG. 1 is an exemplary embodiment of a warehouse configuration.

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawing(s) and description are to be regarded as illustrative in nature and not as restrictive.

DETAILED DESCRIPTION OF THE PREFERRED EMBODIMENT

FIG. 1 illustrates an exemplary embodiment of a warehouse configuration, wherein a plurality of racks 2, on which goods or packages are stored, are aligned to form a plurality of spaced-apart aisles 3 between the racks 2. The warehouse configuration may also include pathways 4 that intersect each other as well as the aisles 3 between the racks 2. The pathways 4 can be defined by walls 5 that may include doors (not shown), windows, or other passageways through which pedestrians 6 or machinery 7 may enter and/or exit the pathways 4. In an embodiment, a corner sensor assembly 10 can be positioned on a corner structure 8 that forms an intersection between adjacent pathways 4 or between a pathway 4 and an aisle 3, or any other intersection at which pedestrian or machinery traffic may potentially collide at a collision location 9. The corner sensor assembly 10 is configured to monitor movement in adjacent pathways 4 and/or aisles 3 to determine if a potential collision may occur and produce a visible and/or auditory warning for all oncoming traffic to prevent an accident from occurring. Each corner sensor assembly 10 includes at least two adjacent or opposing fields of monitoring 11, as shown in shaded areas in FIG. 1, wherein the fields of monitoring 11 are different. The corner sensor assembly 10 is configured to detect motion within each of these adjacent fields of monitoring 11 and provide a warning if there is motion within both adjacent fields of monitoring 11, as will be explained below. It should be understood by one of ordinary skill in the art that the warehouse configuration shown in FIG. 1 is merely exemplary, yet the corner sensor assembly 10 can be utilized in any office or building in which pedestrian and/or machinery traffic may intersect to prevent accidental collisions therebetween.

Figure 2:
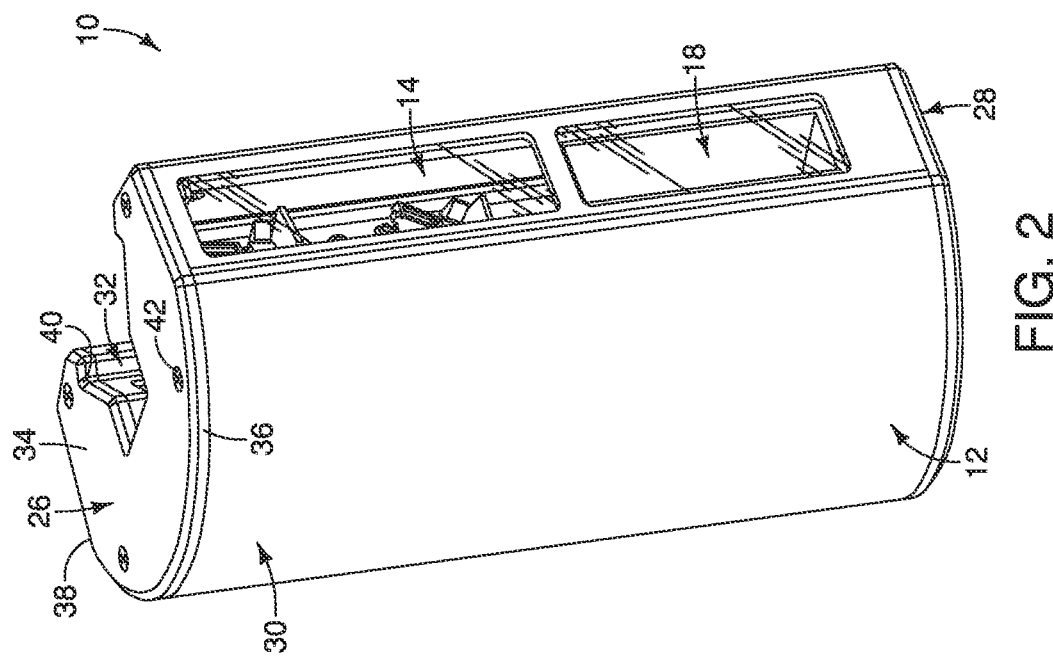
FIG. 2 is a top perspective view of an embodiment of a corner sensor assembly.
Figure 3:
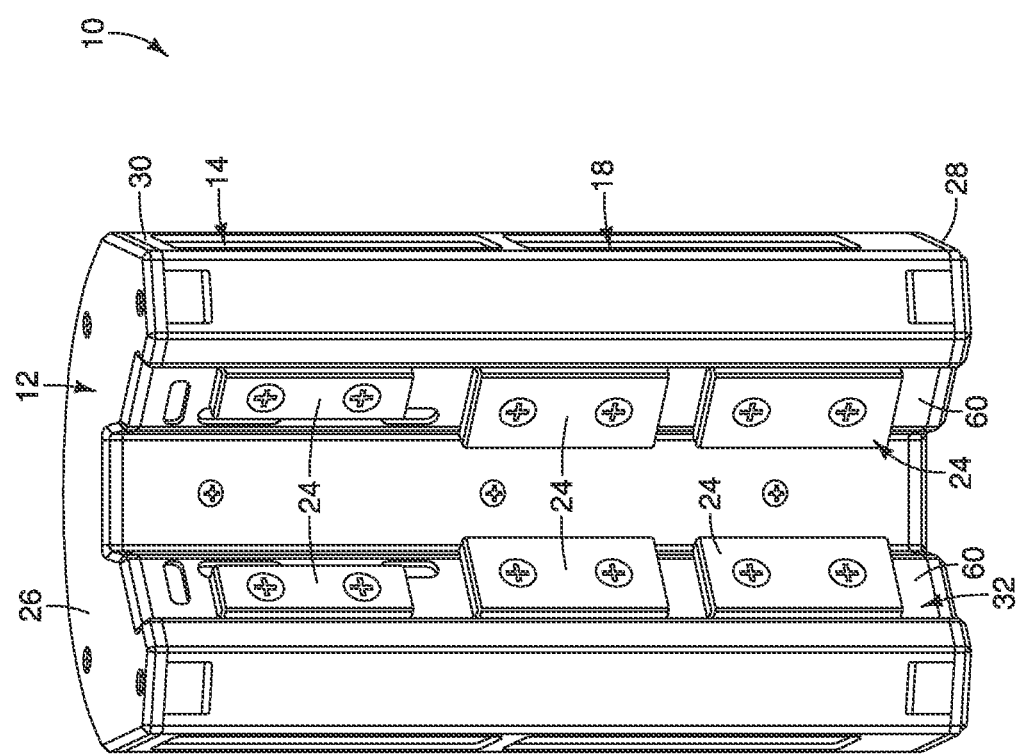
FIG. 3 is a top rear perspective view of the corner sensor assembly shown in FIG. 2.
Figure 4:
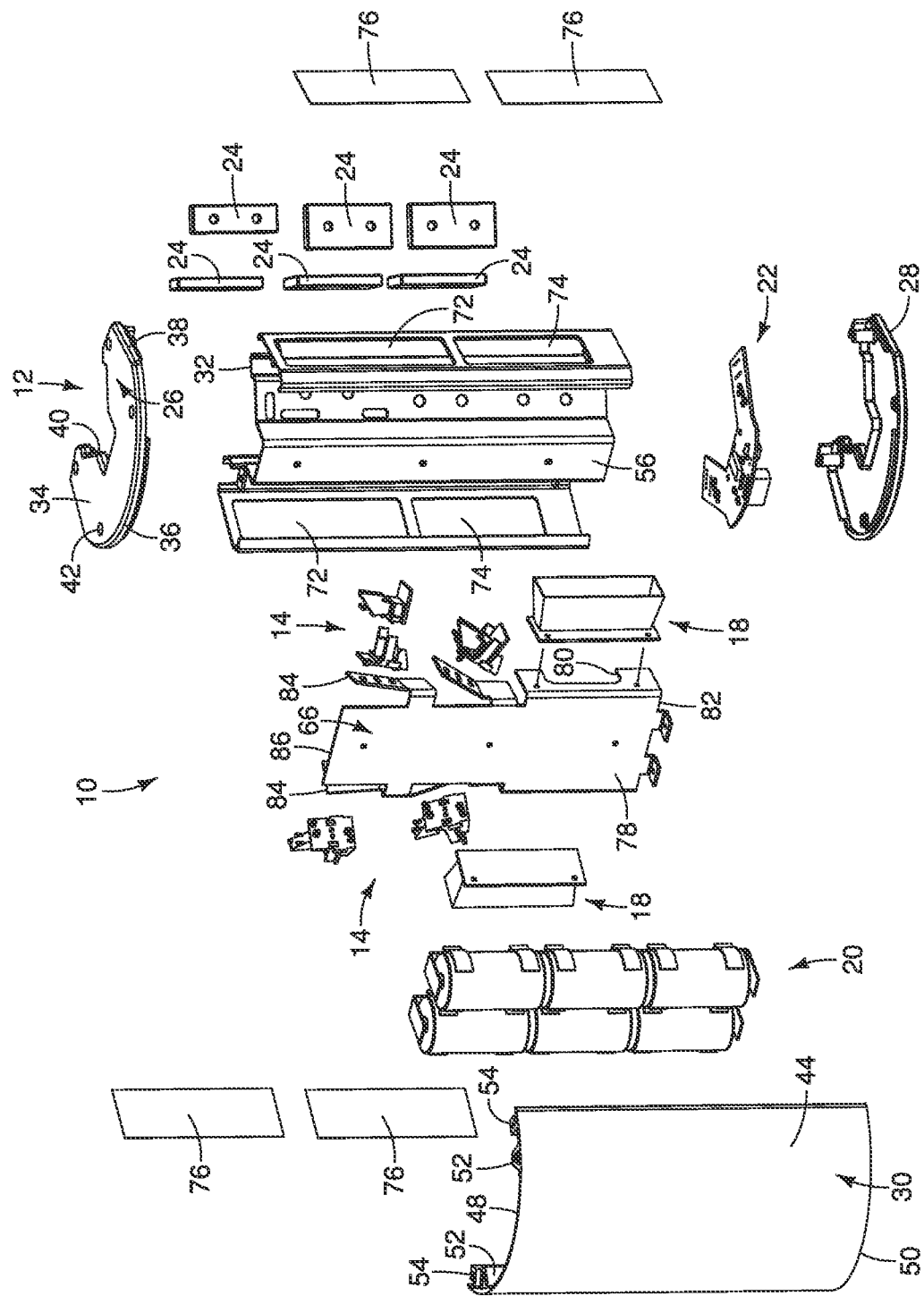
FIG. 4 is an exploded view of the corner sensor assembly shown in FIG. 2.

Referring to FIGS. 2-4, an exemplary embodiment of a corner sensor assembly 10 is shown. The corner sensor assembly 10 can be removably positioned on a corner of two joining pathways within an office, warehouse, or any other building, wherein the corner sensor assembly 10 is configured to sense oncoming pedestrians, vehicles, or objects within one pathway and provide a warning sign to the adjacent pathway of the oncoming object. The sensor assembly 10 is a compact unit that can be easily installed onto an outer corner of a wall, walkway, storage rack, or the like. The sensor assembly 10 is removable such that the unit can be vertically repositioned on a corner or moved from one corner to another with ease.

As illustrated in FIGS. 2-4, the corner sensor assembly 10 includes a housing 12, a plurality of sensors 14, a plurality of visual indicators 18, a power supply 20, a controller 22, and at least one magnet 24. The housing 12 includes an upper end cap 26, an opposing lower end cap 28, a front cover 30, and a rear plate 32. The upper and lower end caps 26, 28 are separately removably securable to the front cover 30 by screws, snap-locking tabs, welding or any other attachment mechanism commonly known in the art. In an embodiment, the upper and lower end caps 26, 28 are removably secured to the front cover 30. In another embodiment, at least one of the upper and lower end caps 26, 28 is integrally connected to the front cover 30. In yet another embodiment, the front cover 30 is integrally formed with at least one of the upper and lower end caps 26, 28. The upper end cap 26, lower end cap 28, and front cover 30 are attachable to the rear plate 32. The upper and lower end caps 26, 28 and the front cover 30 can be separately removable from each other and the rear plate 32, or the upper and lower end caps 26, 28 and the front cover 30 can be joined together in any combination into a larger component that is removable from the rear plate 32. In the illustrated exemplary embodiment, the upper end cap 26 is attached to the front cover 30, and this combined component is selectively removable from the rear plate 32 to which the lower end cap 28 is separately removably attached.

As shown in FIG. 5, an exemplary embodiment of an upper end cap 26 is shown. The upper end cap 26 is a generally rounded member and a thickness sufficient to protect the upper portion of the corner sensor assembly 10. The upper end cap 26 includes a substantially flat upper surface 34, a curved front edge 36, a pair of opposing sensor edges 38 extending from the front edge 36, and a rear edge 40 extending between the opposing sensor edges 38. The front edge 36 is shaped to have a substantially similar and corresponding radius of curvature as the front cover 30. Each of the sensor edges 38 is substantially linear and positioned above and adjacent to a sensor 14. The rear edge 40 is a compound edge having substantially the same general shape as the rear plate 32. In an embodiment, the upper end cap 26 includes four (4) apertures 42 through which an attachment mechanism such as a bolt or the like can be disposed for connecting the upper end cap 26 to the front cover 30 and/or the rear plate 32. It should be understood by one of ordinary skill in the art that the upper end cap 26 can include any number of apertures 42, or a lack thereof, sufficient to operatively connect the upper end cap 26 to the front cover 30 and/or the rear plate 32. The lower end cap 28 is a mirror image thereof to provide similar protection to the lower portion of the corner sensor assembly 10. The upper and lower end caps 26, 28 are configured to abut the corresponding upper and lower edges of the front cover 30 and rear plate 32.

An exemplary embodiment of a front cover 30 is shown in FIGS. 2, 4, and 6. The front cover 30 is a curved member having a front surface 44, a rear surface 46, an upper edge 48, and a lower edge 50. In an exemplary embodiment, the front cover 30 has a substantially continuous radius of curvature between the lateral edges that extend between the upper and lower edges 48, 50. In another embodiment, the front cover 30 can be formed as having a squared or rectangular cross-sectional shape. It should be understood by one of ordinary skill in the art that the front cover 30 can be formed of any general shape that can conform to a corner to which the corner sensor assembly 10 is attached. In an embodiment, the front cover 30 is formed of extruded plastic, aluminum, fiberglass, or any other material sufficient to withstand potential impact with moving vehicles or the like. A pair of bosses 52 extend from the rear surface 46 adjacent to both the upper and lower edges 48, 50. The bosses are configured to receive an attachment mechanism such as a bolt, thereby allowing the upper and lower end caps 26, 28 to be removably attachable to the front cover 30.

The front cover 30 also includes a channel 54 extending from the rear surface 46. In an embodiment, the channels 54 extend the entire height between the upper and lower edges 48, 50 of the front cover 30, as shown in FIGS. 4 and 6. In another embodiment, channels 54 only extend a portion of the height between the upper and lower edges 48, 50 of the front cover 30. In the exemplary illustrated embodiment, the channels 54 have a general U-shape, or hook-shape. In another embodiment, the channels 54 are formed as T-shaped grooves. In still another embodiment, the channels 54 are formed as T-shaped projections that extend from the rear surface 46. It should be understood by one of ordinary skill in the art that the channels 54 can be formed of any shape sufficient to provide a connection between the front cover 30 and the rear plate 32 that allows the front cover 30 to be selectively removable from the rear plate 32. In still another embodiment, the channels 54 can be formed as flexible clips that can be received in a groove formed into the rear plate 32. It should also be understood by one of ordinary skill in the art that although the channels 54 are shown in the exemplary embodiment as a female connector of a male-female connection, the channels 54 may also be formed as a male connector. The front cover 30 is selectively removable from the rear plate 32 to provide an operator access to the components within the housing 12.

Figure 7A:
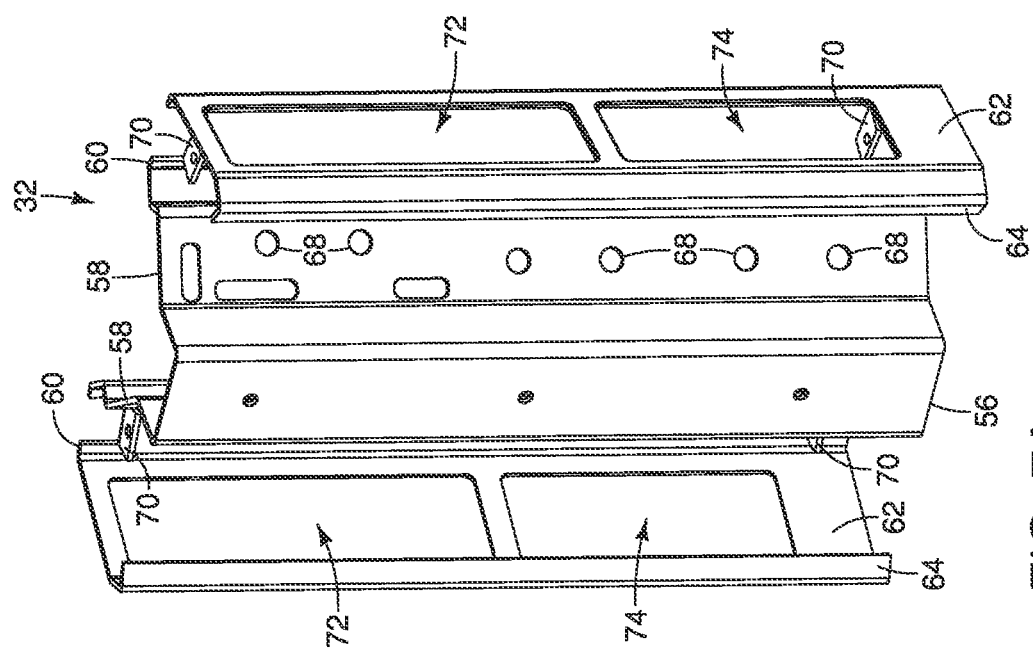
FIG. 7A is a perspective view of a rear plate.
Figure 7B:
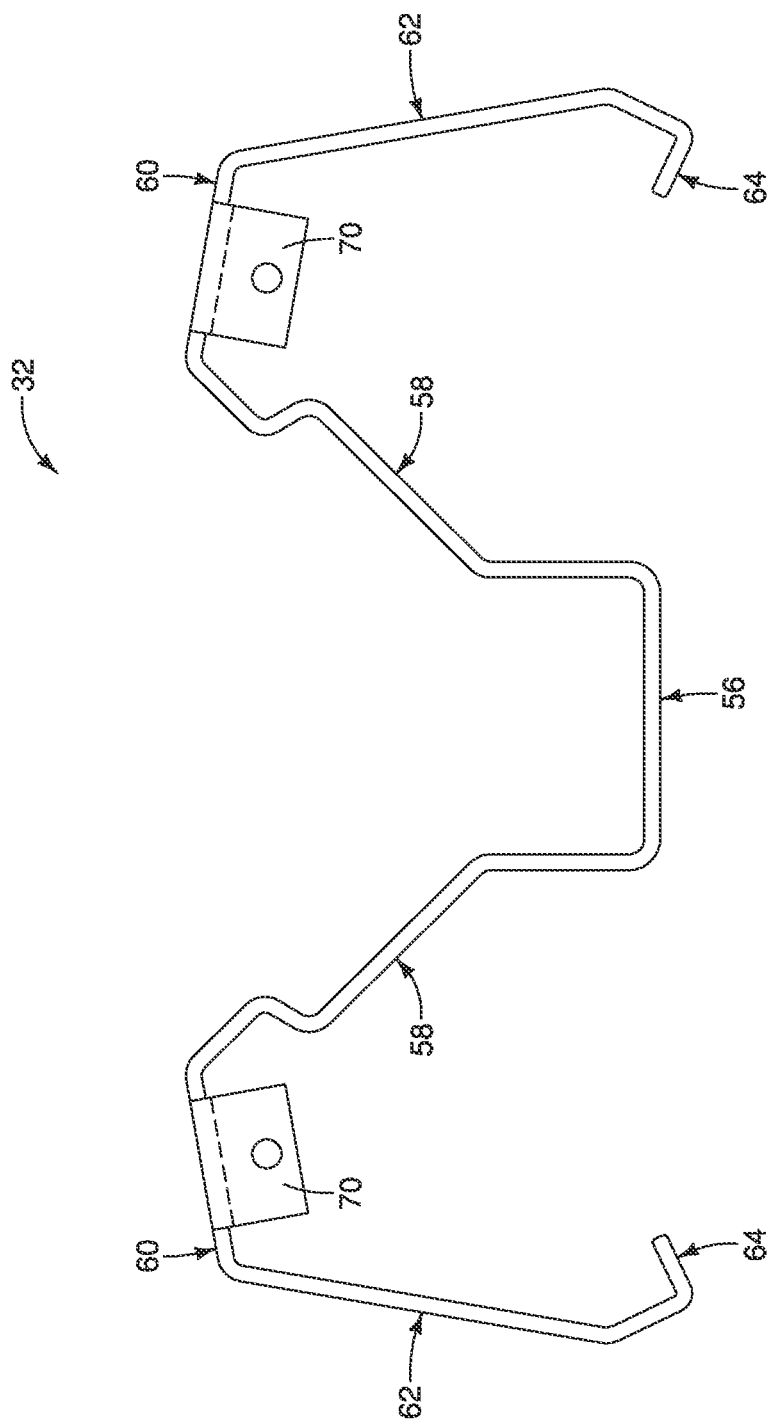
FIG. 7B is a top view of the rear plate shown in FIG. 7A.

In an embodiment, the rear plate 32 is an elongated component having a compound shape having a W-shaped or M-shaped cross-section, as shown in FIGS. 7A-7B. The rear plate 32 can be formed of metal, plastic, fiberglass, or any other material sufficient to provide a rigidity and support for the corner sensor assembly 10. In an embodiment, the rear plate 32 is formed of stamped metal, wherein the stamping process forms a continuous component having a non-planar shape as will be described below. The rear plate 32 is formed of a generally U-shaped central base portion 56 having opposing angled portions 58 extending at an angle from the base portion 56. The rear plate 32 further includes an attachment portion 60 extending from each angled portion 58 and a side portion 62 extending from each attachment portion 60. A tongue 64 configured to be received in the corresponding channel 54 of the front cover 30 extends from the side portion 62 of the rear plate 32. In an embodiment, the base portion 56, angled portions 58, attachment portions 60, and tongues 64 are integrally formed as a single member.

The base portion 56 of the rear plate 32 is generally U-shaped and is configured to receive the corner of the wall structure to which the corner sensor assembly 10 is attached. The base portion 56 includes a plurality of holes that allow the mounting plate 66 to be attached to the rear plate 32. The angled portions 58 extend from the base portion 56 at an angle, wherein the opposing angled portions 58 are oriented substantially perpendicular relative to each other. The angled portions 58 are configured to be aligned with the adjacent surfaces of the corner to which the corner sensor assembly 10 is attached. In an embodiment, each angled portion 58 includes a plurality of apertures 68 formed therethrough, wherein the apertures 68 are configured to allow the corner sensor assembly 10 to be attached to a corner structure 8 (FIG. 1).

Each of the attachment portions 60 includes a tab 70 positioned adjacent to both the upper and lower edges of the rear plate 32, as shown in FIGS. 4 and 7A-7B. The tabs 70 are oriented at an angle relative to the corresponding attachment portion 60 in a substantially perpendicular manner such that the tabs 70 are directed generally toward the base portion 56. Each tab 70 includes an aperture formed therethrough, wherein the aperture is configured to receive a screw, bolt, or the like for allowing the upper and lower end caps 26, 28 to be secured to the tabs 70 of the rear plate 32.

As shown in FIGS. 7A-7B, each side portion 62 extends away from a corresponding attachment portion 60 at an angle relative thereto. In the exemplary embodiment illustrated in FIGS. 2, 4, and 7A-7B, each side portion 62 includes an upper window 72 and a lower window 74, which are apertures formed through the thickness of the side portions 62 to provide side openings to the corner sensor assembly 10. In an embodiment, the upper and lower windows 72, 74 each have an elongated rounded rectangular shape. It should be understood by one of ordinary skill in the art that the upper and lower windows 72, 74 can be formed of any shape sufficient to provide windows through the housing 12 to allow the sensors 14 and visual indicators 18 positioned within the housing 12 to communicate with the ambient surroundings of the corner sensor assembly 10. The housing 12 includes at least one visual indicator 18 directed toward one field of monitoring 11 and a second visual indicator 18 directed toward the other field of monitoring 11 such that a visual indicator 18 can be seen by pedestrians or machinery operators when moving in a field of monitoring 11. It should be understood by one of ordinary skill in the art that although the illustrated exemplary embodiment of the corner sensor assembly 10 illustrates two visual indicators 18 directed in opposing directions toward respective fields of monitoring 11, the corner sensor assembly 10 may also include a single visual indicator 18 that is visible to pedestrians or machinery located in both fields of monitoring 10. In such a configuration, the single visual indicator 18—such as a light—can be positioned adjacent to the bottom of the housing 12 and directed in a visible field of at least 180° but can also have a visible field up to 360°. The single visual indicator 18 can also be positioned within the housing and configured to be visible by all approaching traffic. In an embodiment, both the upper and lower windows 72, 74 have the same size and shape. In another embodiment, the upper windows 72 are shaped differently than the lower windows 74. It should be understood by one of ordinary skill in the art that although the figures illustrate an upper window 72 positioned vertically above a lower window 74, there may be any number of windows formed through each side portion 62 and when more than one window is formed therethrough, those windows can be aligned in any manner or pattern. In the exemplary embodiment, each of the upper and lower windows 72, 74 has a lens 76 (FIG. 4) operatively connected thereto and positioned therewithin to cover the windows. Although the illustrated embodiment shows one visual indicator 18 directed toward one field of monitoring 11 and a second visual indicator 18 directed toward the other field of monitoring 11, it should be understood by one of ordinary skill in the art that a single visual indicator 18 can be used such the visual indicator 18 can be seen from both fields of monitoring 11.

The housing 12 of the corner sensor assembly 10 is attachable to a corner structure by way of a plurality of magnets 24 attached to the rear plate 32 of the housing 12, as shown in FIG. 3. The magnets 24 are attached to the attachment portion 60 of the rear plate 32 using screws. The magnets 24 are positioned such that each vertical column of magnets 24 is oriented at a right angle relative to the opposing column of magnets 24. However, it should be understood by one of ordinary skill in the art that the rear plate 32 and magnet 24 orientations can be formed at any angle to be attachable to corner structures 8 having different angles. The rear plate 32 or the magnets may also be adjustable to allow the magnets to adjust the relative angle therebetween so as to allow the corner sensor assembly 10 to be attached to corner structures 8 having any angle. In another embodiment, a single magnet 24 can be attachable to each of the opposing attachment portions 60 of the rear plate 32 such that each magnet 24 contacts an adjacent surface of a corner structure. It should be understood by one of ordinary skill in the art that any number of magnets 24 can be attachable to the housing 12 and aligned in any orientation or pattern so long as the magnets 24 are configured to contact adjacent surfaces of a corner structure to which the corner sensor assembly 10 is attachable. The magnets 24 allow the corner sensor assembly 10 to be easily attachable to a corner structure as well as easily removable therefrom for repair, replacement, repositioning, or relocating the corner sensor assembly 10.

Figure 8:
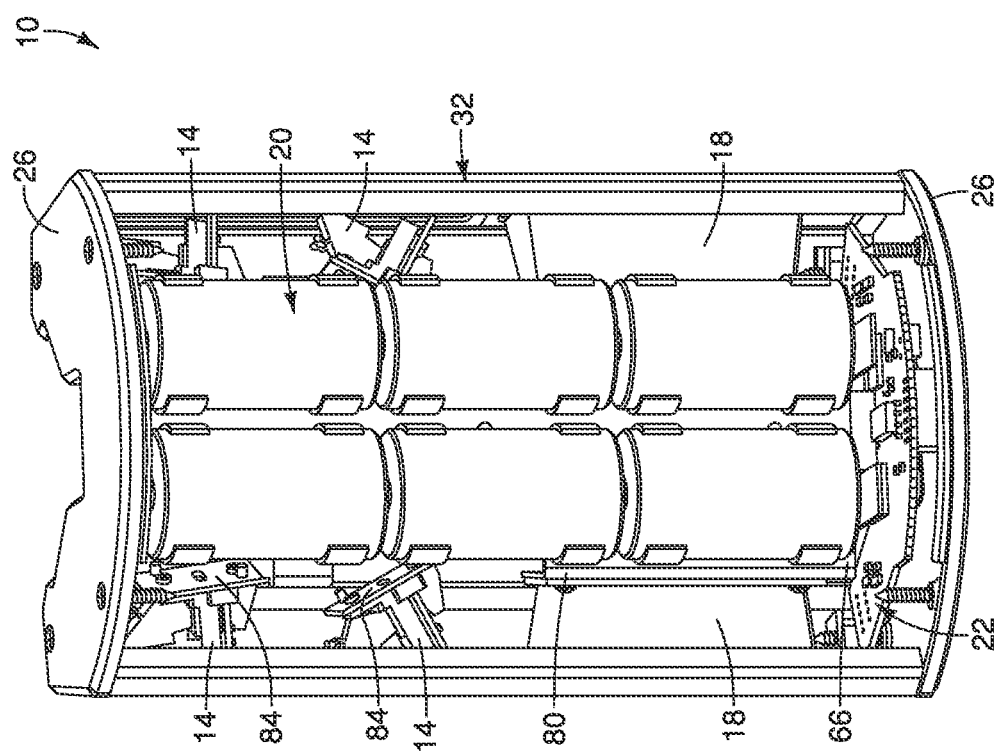
FIG. 8 is an embodiment of the corner sensor assembly with the front cover removed.

The housing 12 is configured to be mountable to a corner structure while protecting the components positioned therewithin. FIG. 8 illustrates an exemplary embodiment of the corner sensor assembly 10 with the front cover 30 removed to show the relative positioning of the internal components. As shown in FIGS. 4 and 8, the mounting plate 66 is attached to the base portion 56 of the rear plate 32. The sensors 14, visual indicators 18, and the power supply 20 are operatively connected to the mounting plate 66. The controller 22 is positioned below the mounting plate 66 and is located between the mounting plate 66 and the lower end cap 28. The mounting plate 66 is formed of stamped metal or formed plastic having a central portion 78 being a substantially planar base that is attached to the rear plate 32. The mounting plate 66 also includes a pair of opposing lower mounting tabs 80 that extend rearwardly from the central portion 78 toward the rear plate 32. The lower mounting tabs 80 are positioned adjacent the lower edge 82 of the mounting plate 66. In the illustrated embodiment, each lower mounting tab 80 is configured to support a visual indicator 18 that is attachable thereto. In another embodiment, each lower mounting tab 80 is configured to support at least one sensor 14 that is attachable thereto. The mounting plate 66 further includes a pair of opposing upper mounting tabs 84 that extend rearwardly from each lateral edge of the central portion 78 toward the rear plate 32 and are also bent laterally outward at an angle relative to the lower mounting tabs 80. The upper mounting tabs 84 are vertically oriented with respect to each other on each corresponding side of the central portion 78 and positioned above the lower mounting tabs 80. The upper mounting tabs 84 are positioned adjacent the upper edge 86 of the mounting plate 66. In the illustrated embodiment, each upper mounting tab 84 is configured to support a sensor 14 that is attachable thereto. In another embodiment, each upper mounting tab 84 is configured to support a visual indicator 18 that is attachable thereto.

As illustrated in FIGS. 4 and 8, an integrated power supply 20 is operatively connected to the mounting plate 66. The power supply 20 is removable and replaceable, and the power supply 20 is located within the housing 12. In the illustrated exemplary embodiment, the power supply 20 includes a plurality of batteries, such as six (6) replaceable D-type batteries or rechargeable D-type batteries. It should be understood by one of ordinary skill in the art that any other type of replaceable batteries may be used as the power supply 20. The power supply 20 is integrated within the housing 12, and it is not necessary to connect the corner sensor assembly 10 to an external power supply such as an electrical wire or solar panel located external to the housing. Instead, the integrated power supply 20 allows the corner sensor assembly 10 to be easily positionable, removable, and relocatable while allowing the corner sensor assembly 10 to be immediately sensing motion and able to provide a warning immediately upon installation or relocation. There is no external power needed to operate the corner sensor assembly 10, whereby the integrated power supply 20 allows the corner sensor assembly 10 to be easily relocatable. It should be understood by one of ordinary skill in the art that the power supply 20 may be any type of power source that is completely integrated within the housing 12 to allow the corner sensor assembly 10 to be installed or relocated without additional set-up of an external power supply. The power supply 20 is configured to provide electrical power the sensors 14, the visual indicators 18, and the controller 22.

In an embodiment, the sensors 14 are integrated within the housing 12 and attached to the upper mounting tabs 84 of the mounting plate 66 and positioned adjacent to the upper end cap 26, as shown in FIG. 8. It should be understood by one of ordinary skill in the art that the sensors 14 may alternatively be attached to the lower mounting tabs 80. In the illustrated embodiment, the corner sensor assembly 10 includes a pair of sensors 14 attached to each opposing side of the mounting plate 66 to monitor the opposing fields of monitoring 11 such that each pair of sensors 14 determine the corresponding field of monitoring 11. It should be understood by one of ordinary skill in the art that at least one sensor 14 is attached to each opposing side of the mounting plate 66 so as to sense oncoming pedestrian or machinery traffic within the aisle 3 or pathway 4 (FIG. 1) approaching a collision location 9. Each sensor 14 of each pair is stacked, or vertically aligned relative to the other sensor 14, but it should be understood by one of ordinary skill in the art that the sensors 14 can be positioned horizontally adjacent to each other, or a single sensor can be used. The sensors 14 are directed outwardly toward the upper window 72 formed in the rear plate 32, and the sensors 14 are configured to sense or determine motion or the moving machinery or pedestrians traffic as they approach the corner structure 8 to which the corner sensor assembly 10 is attached. The sensors 14 are integrated and located within the housing 12 and covered by a screen 76 to protect the sensor 14 from damage. The sensors 14 are pre-adjusted, or attached to the upper mounting tabs 84 in a manner that does not require the sensors 14 to be realigned after each time the corner sensor assembly 10 is relocated to a different location. The pre-adjusted sensors 14 have a fixed field of view that does not need to be changed when the corner sensor assembly 10 is relocated from one corner structure to another. Instead, the sensors 14 are configured to maximize and optimize the field of monitoring 11 for each pathway 4 adjacent to the corner structure 8 to which the corner sensor assembly 10 it is attached. The sensors 14 have a fixed dispersion angle.

The sensors 14 are motion sensors and configured to detect movement, especially pedestrian movement or movement of machinery within the fields of monitoring 11, as the traffic is near the corner sensor assembly 10 so the pedestrian or machinery operator can be warned in order to prevent a crash or contact with another pedestrian and/or machinery that is approaching the same corner from a different direction, as explained above with respect to FIG. 1. The sensors 14 can be passive infrared sensors (PIR), ultrasonic sensors, microwave sensors, tomographic sensors, or visual or video sensors. It should be understood by one of ordinary skill in the art that the sensors 14 can be any type of sensor or a combination of these and/or other sensors configured to detect motion. While the sensors 14 are configured to detect motion, the visual indicators 18 are configured to alert oncoming traffic that an adjacent walkway or pathway 4 or aisle 3 (FIG. 1) also includes oncoming traffic.

Each sensor 14 is configured to generate or provide an output when motion is detected as well as an output when no motion is detected. For example, when a pedestrian or machinery enters a field of monitoring 11, the sensor 14 monitoring that field of monitoring 11 produces an active output to indicate motion within the field of monitoring 11. When the pedestrian or machinery stops moving or moves outside the field of monitoring 11, the sensor 14 changes to produce an inactive output to indicate there is no motion within the field of monitoring 11. The output from each sensor 14 changes when motion is initially detected and changes again when no more motion is detected.

One problem often encountered with motion sensors within a warehouse is motion that is detected through empty racks or shelves. In other words, the field of monitoring of the sensors is so broad that the sensors not only monitor the motion within the aisle or pathway immediately adjacent thereto but also motion within further aisles between racks due to no packaging or products blocking the detectable motion. The sensors 14 of the corner sensor assembly 10 have a narrowed angle of detection such that the field of monitoring 11 is limited primarily to only the immediately adjacent aisle 3 or pathway 4.

As shown in FIGS. 4 and 8, the visual indicators 18 are attached to the lower mounting tabs 80 of the mounting plate 66. It should be understood by one of ordinary skill in the art that the visual indicators 18 may alternatively be attached to the upper mounting tabs 84. The visual indicators 18 are configured to provide a visual alert or warning to approaching pedestrians or machinery of traffic approaching from both adjacent pathways within the fields of monitoring. In an embodiment, the visual indicators 18 are formed as light emitting diodes (LEDs), halogen bulbs, or any other electrically controllable light source. The visual indicators 18 include an inactive state in which no visual alert is being produced as well as an active state in which the visual alert is provided or illuminated. In an embodiment, when the visual indicators 18 are in the active state, the visual alert is a constant-on state. In another embodiment, when the visual indicators 18 are in the active state, the visual alert is an intermittent or flashing. It should be understood by one of ordinary skill in the art that the active state of the visual indicators 18 can provide any visual alert or cue sufficient to provide a warning to pedestrian and machinery traffic approaching the corner sensor assembly 10. The sensors 14 and visual indicators 18 are located within the housing 12, and a screen 76 is positioned over each visual indicator 18 and sensor 14 to provide protection to these members from any dirt or debris while still allowing full functionality of the sensors 14 without signal degradation and also allowing the visual alert still be seen by oncoming pedestrians and machinery operators. The visual indicators 18 as well as the sensors 14 are operatively controlled by the controller 22.

As shown in FIGS. 4 and 8, the controller 22 is operatively connected to the mounting plate 66. The controller 22 receives electrical power from the power supply 20 and routes electrical power to the sensors 14 and the visual indicators 18. The sensors 14 are configured to generate an output that is received by the controller 22, wherein the output generated by the sensors 14 indicates either the lack of detected motion or the presence of detected motion. In an embodiment, the sensors 14 are in an always-on state in which each sensor 14 is continually monitoring its field of monitoring 11 while continually providing an output that is received by the controller 22 to indicate the presence or absence of detected motion. When there is no motion within a field of monitoring 11 for a sensor 14, that sensor 14 provides an inactive output to the controller 22 indicating that there is no motion. Otherwise, when there is motion sensed in the field of monitoring 11 for a sensor 14, that sensor provides an active output to the controller 22 indicating that there is motion such as a pedestrian or machinery within the field of monitoring 11. Because each sensor 14 is constantly monitoring for motion within its respective field of monitoring 11, the controller 22 is continually receiving and comparing the output provided by each of the sensors 14 to determine if and when there is a change in any output received from the sensors 14.

Each of the visual indicators 18 is operatively connected to the controller 22. When the controller 22 determines that there is pedestrian or machinery traffic approaching from both opposing fields of monitoring 11 due to the output received by opposing sensors 14, the controller 22 causes the visual indicators 18 to change from an inactive state to an active state. When motion ceases to be detected in one of or all (simultaneously) of the fields of monitoring 11 by the sensors 14, the output provided to the controller 22 by at least one sensor 14 changes to indicate no motion and the controller 22 changes the visual indicators 18 from the active state to the inactive state. When motion is sensed in both of the fields of monitoring 11, the controller 22 changes the visual indicators 18 to an active state such that the pedestrian traffic or vehicle operators in both adjacent pathways 4 are alerted of oncoming traffic and are warned of a potential accident. In an embodiment, when the controller 22 determines that there is motion detected in each adjacent field of monitoring 11, the controller 22 changes all visual indicators 18 to an active state. The controller 22 is configured change all visual indicators 18 to an active state only when motion is sensed within both opposing fields of monitoring 11. By changing the visual indicators 18 to an active state only when motion is sensed in both opposing fields of monitoring 11 instead of when motion is sensed in only one field of monitoring 11, the drain on the power supply 20 is reduced.

In another embodiment, the visual indicators 18 have an override mode in which the visual indicators 18 remain in a continuous active state without regard to the output from the sensors 14. For example, a depressible override button (not shown) extends from the housing 12. The override button is operatively connected to the controller 22, wherein the override button is depressible to override the outputs from the sensors 14 and causes the controller 22 to change the visual indicators 18 to remain in an active state. This can be particularly useful when someone is continuously working in an aisle 3 or pathway 4 so as to warn all approaching traffic that there is a collision potential at a collision location 9. When the override button is initially depressed, the visual indicators 18 are changed to the active state until the override button is depressed again, wherein the sensor 14 again continuously monitoring their respective field of monitoring 11 and the state of the visual indicators 18 are changed accordingly. This override button can be used when the corner sensor assembly 10 is attached to the rear corner of a tractor trailer when loading/unloading the trailer. The override button activates the visual indicators 18 so that any approaching pedestrians or other machinery are alerted that an operator is continuously loading or unloading the trailer.

In another embodiment, the corner sensor assembly 10 includes an audible indicator (not shown) in addition to the visual indicators 18 to provide an audible sound to indicate detected motion in both of the adjacent fields of monitoring 11. The audible indicator is operatively connected to the controller 22 such that the controller can change the audible indicator between an inactive state and an active state. In operation, the controller 22 changes the visual indicators 18 and the audible indicator to the active state simultaneously when motion is sensed in both adjacent fields of monitoring 11 and likewise changes the visual indicators 18 and the audible indicator to an inactive state no motion is sensed in at least one of the fields of monitoring 11.

In an embodiment, the corner sensor assembly 10 includes a power indicator (not shown) that is illuminated or flashes when the power supply 20 is low on power. The power indicator may be a light that shines or flashes or may be an audible sound to indicate that the power supply 20 is low. The power indicator can be positioned on the upper or lower end cap 26, 28 to allow passing pedestrians to determine if or when the power supply 20 is low.

In another embodiment, a tether or zip-tie can be used in combination with the magnets 24 to secure the corner sensor assembly 10 to the corner of a rack 2 or the like to prevent the assembly from becoming disengaged if struck by a moving vehicle. The tether or zip-tie can be used to provide additional support or securing mechanism for the corner sensor assembly 10.

Figure 9A:
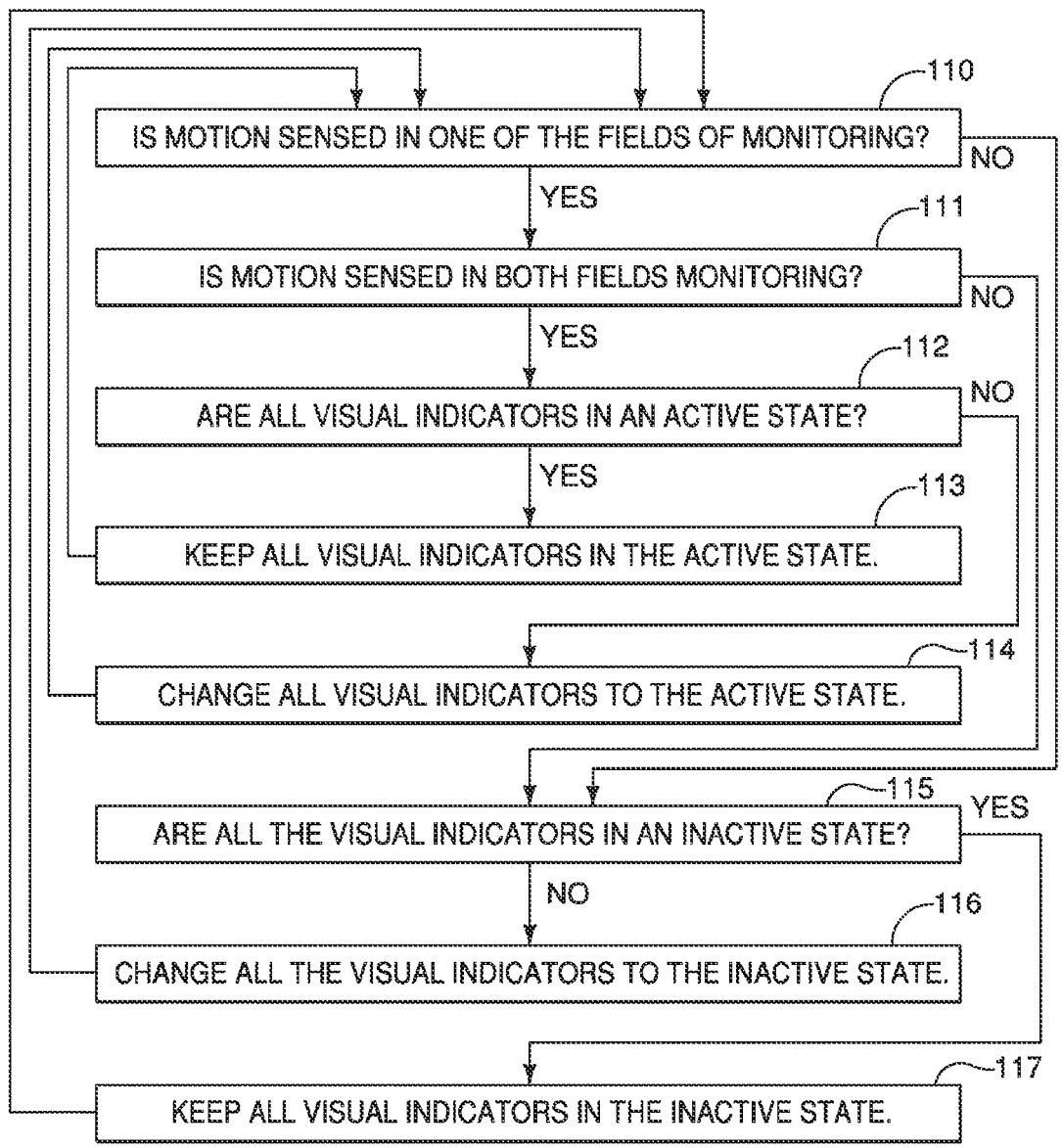
FIG. 9 is a schematic diagram of a corner sensor assembly.
FIG. 9B is a schematic diagram of a corner sensor assembly with an override button.

As shown in the flowchart of FIG. 9A, in operation of an embodiment of a corner sensor assembly 10, the controller 22 receives the output from at least one sensor 14 monitoring one of the fields of monitoring 11 to determine if there is currently sensed motion therewithin, as shown in block 110. If there is motion sensed in one of the fields of monitoring 11, the controller 22 receives the output from at least one sensor 14 monitoring the other field of monitoring 11 to determine if there is currently sensed motion therewithin, as shown in block 111. If the controller 22 receives an active output from sensors 14 indicating that there is sensed motion in both fields of monitoring 11, the controller 22 determines if all the visual indicators 18 are already in an active state, as shown in block 112. If all visual indicators 18 are in an active state, then the controller 22 maintains the visual indicators 18 in the active state, as shown in block 113. Otherwise, if all of the visual indicators 18 are not in an active state, then the controller 22 changes the visual indicators 18 to the active state, as shown in block 114. When motion has been detected in both of the fields of monitoring 11 and the visual indicators 18 are in the active state, the controller 22 receives the output from at least one sensor 14 monitoring one of the fields of monitoring 11 to determine if there is currently sensed motion therewithin, as shown in block 110. If there is no motion detected in one of the fields of monitoring 11, as determined in block 110, or if motion is sensed in one of the fields of monitoring 11 but not both, as determined in block 111, then the controller 22 determines if all the visual indicators 18 are already in an inactive state, as shown in block 115. If all of the visual indicators 18 are not in an inactive state, then the controller 22 changes the visual indicators 18 to the inactive state, as shown in block 116. Otherwise, if all visual indicators 18 are in an inactive state, then the controller 22 maintains the visual indicators 18 in the inactive state, as shown in block 117. When motion has not been detected in one of the fields of monitoring 11 or motion has been detected in one but not both of the fields of monitoring 11 and the visual indicators 18 are in the inactive state, the controller 22 receives the output from at least one sensor 14 monitoring one of the fields of monitoring 11 to determine if there is currently sensed motion therewithin, as shown in block 110.

Figure 9B:
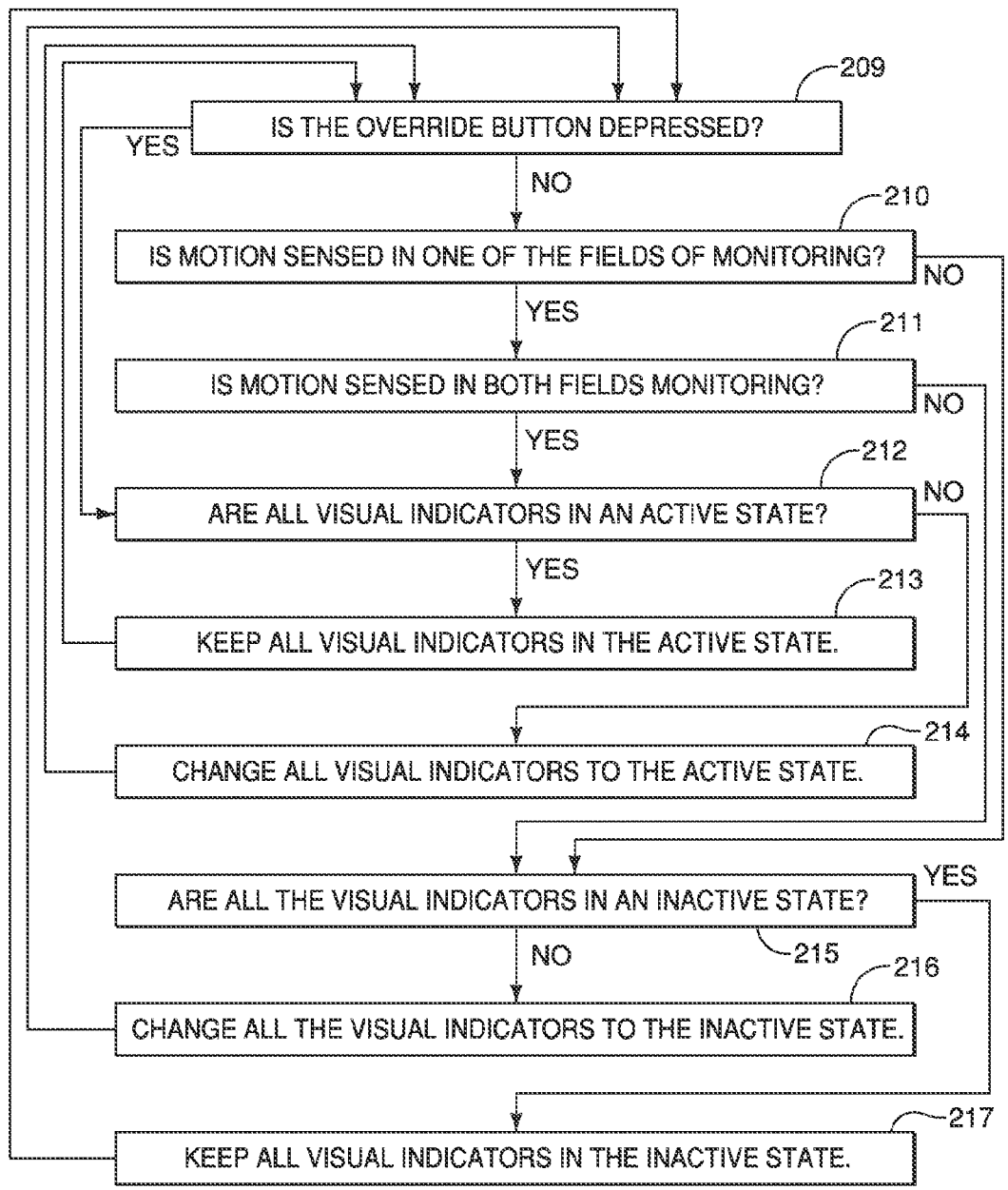

As shown in the flowchart of FIG. 9B, in operation of an embodiment of a corner sensor assembly 10 having an override button, the controller 22 receives an output from the override button to determine if the button has been depressed, as shown in block 209. If the controller 22 determines that the override button has been depressed, the controller 22 determines if all the visual indicators 18 are in an active state, as shown in block 212. Otherwise, if the controller 22 determines that the override button has not been depressed then the controller 22 then receives the output from at least one sensor 14 monitoring one of the fields of monitoring 11 to determine if there is currently sensed motion therewithin, as shown in block 210. If there is motion sensed in one of the fields of monitoring 11, the controller 22 receives the output from at least one sensor 14 monitoring the other field of monitoring 11 to determine if there is currently sensed motion therewithin, as shown in block 211. If the controller 22 receives an active output from sensors 14 indicating that there is sensed motion in both fields of monitoring 11, the controller 22 determines if all the visual indicators 18 are already in an active state, as shown in block 212. If all visual indicators 18 are in an active state, then the controller 22 maintains the visual indicators 18 in the active state, as shown in block 213. Otherwise, if all of the visual indicators 18 are not in an active state, then the controller 22 changes the visual indicators 18 to the active state, as shown in block 214. When motion has been detected in both of the fields of monitoring 11 and the visual indicators 18 are in the active state, the controller 22 receives the output from the override button to determine if the override button has been depressed, as shown in block 209. Alternatively, if the controller 22 determines that the override button has not been depressed and if there is no motion detected in one of the fields of monitoring 11, as determined in block 210, or if motion is sensed in one of the fields of monitoring 11 but not both, as determined in block 211, then the controller 22 determines if all the visual indicators 18 are already in an inactive state, as shown in block 215. If all of the visual indicators 18 are not in an inactive state, then the controller 22 changes the visual indicators 18 to the inactive state, as shown in block 216. Otherwise, if all visual indicators 18 are in an inactive state, then the controller 22 maintains the visual indicators 18 in the inactive state, as shown in block 217. When the override button has not been depressed and either motion has not been detected in one of the fields of monitoring 11 or motion has been detected in one but not both of the fields of monitoring 11 in addition to the visual indicators 18 being in the inactive state, the controller 22 receives the output from the override button to determine whether the override button has been depressed, as shown in block 110.

While preferred embodiments of the present invention have been described, it should be understood that the present invention is not so limited and modifications may be made without departing from the present invention. The scope of the present invention is defined by the appended claims, and all devices, processes, and methods that come within the meaning of the claims, either literally or by equivalence, are intended to be embraced therein.

What is claimed is:

1. A method for sensing a potential collision at an intersection within a building, said method comprising:
   providing a housing having an integrated power supply located therein, at least two motion sensors operatively connected to said housing and said power supply, and at least one visual indicator operatively connected to said housing and said power supply;
   monitoring a first field of monitoring for motion at said intersection with one of said at least two motion sensors;
   monitoring a second field of monitoring for motion at said intersection with another of said at least two motion sensors;
   activating said at least one visual indicator when said motion is sensed in both of said first and second fields of monitoring.

2. The method of claim 1 further comprising deactivating said at least one visual indicator when said motion is not sensed in both said first field of monitoring and said second field of monitoring.

3. The method of claim 1, wherein said first field of monitoring does not overlap said second field of monitoring.

4. The method of claim 1 further comprising attaching said housing to a corner structure at said intersection.

5. The method of claim 4, wherein said housing includes a plurality of magnets attached thereto, and said step of attaching said housing includes releasably attaching said housing to said corner structure.

6. The method of claim 1, wherein the steps of monitoring said first filed of monitoring and monitoring said second field of monitoring includes passively monitoring at least one of said first and second fields of monitoring.

7. The method of claim 1, wherein said at least two motions sensors are formed of a passive infrared sensor (PIR), an ultrasonic sensor, a microwave sensor, a tomographic sensor, or a video sensor.

8. A method for sensing a potential collision at an intersection within a building, said method comprising:
   providing a housing having an integrated power supply, at least two motion sensors operatively connected to said housing and said power supply, at least one visual indicator operatively connected to said housing and said power supply, and a controller positioned within said housing and operatively connected to said at least two motion sensors, said power supply, and said at least one visual indicator;
   monitoring a first field of monitoring for motion at said intersection with one of said at least two motion sensors;
   outputting a first active signal to said controller only when motion is sensed within said first field of monitoring;
   monitoring a second field of monitoring for motion at said intersection with another of said at least two motion sensors;
   outputting a second active signal to said controller only when motion is sensed within said second field of monitoring;
   activating said at least one visual indicator by said controller when said controller simultaneously receives said first active signal and said second active signal.

9. The method of claim 8, wherein said at least two motion sensors cease outputting said first or second active signals when motion is not sensed within said first or second field of monitoring.

10. The method of claim 9 further comprising deactivating said at least one visual indicator by said controller when either said first active signal or said second active signal is not received by said controller.

11. A corner sensor assembly for releasable attachment to a corner structure, said corner sensor assembly comprising:
    a housing having an integrated power supply positioned within said housing;
    at least two motion sensors for sensing motion within separate and non-overlapping fields of monitoring at an intersection within a building, wherein said at least two motion sensors are operatively connected to said housing and said power supply; and
    at least one visual indicator changeable between an active state and an inactive state for providing a visual warning signal of a potential collision in response to motion sensed within at least two of said fields of monitoring, each of said at least one visual indicator being operatively connected to said housing, said power supply, and each of said at least two motion sensors.

12. The corner sensor assembly of claim 11 further comprising a plurality of magnets attached to said housing to allow said housing to be releasably attachable to said corner structure.

13. The corner sensor assembly of claim 11, wherein said at least two motions sensors are formed of a passive infrared sensor (PIR), an ultrasonic sensor, a microwave sensor, a tomographic sensor, or a video sensor.

* * * * *